(12) United States Patent
Teggatz et al.

(10) Patent No.: US 10,338,613 B2
(45) Date of Patent: Jul. 2, 2019

(54) CIRCUITS AND METHODS FOR PROVIDING POWER AND DATA COMMUNICATION IN ISOLATED SYSTEM ARCHITECTURES

(71) Applicant: Triune Systems, L.L.C., Plano, TX (US)

(72) Inventors: Ross E. Teggatz, Plano, TX (US); Eric C. Blackall, Plano, TX (US); Amer H. Atrash, Dallas, TX (US); David J. Baldwin, Allen, TX (US)

(73) Assignee: Triune Systems, L.L.C., Plano, TX (US)

( * ) Notice: Subject to any disclaimer, the term of this patent is extended or adjusted under 35 U.S.C. 154(b) by 350 days.

(21) Appl. No.: 15/058,701

(22) Filed: Mar. 2, 2016

(65) Prior Publication Data

US 2017/0255212 A1 Sep. 7, 2017

(51) Int. Cl.
*H02J 9/02* (2006.01)
*G05F 1/10* (2006.01)

(52) U.S. Cl.
CPC ..................... *G05F 1/10* (2013.01)

(58) Field of Classification Search
CPC ............ G05F 1/10; G05B 15/02; H02M 7/06
USPC ........................................................ 307/113
See application file for complete search history.

(56) References Cited

U.S. PATENT DOCUMENTS

| 4,078,720 | A | 3/1978 | Nurnberg |
| 4,093,943 | A | 6/1978 | Knight |
| 4,157,506 | A | 6/1979 | Spencer |
| 4,308,991 | A | 1/1982 | Peinetti et al. |
| 4,504,778 | A | 3/1985 | Evans |
| 4,528,459 | A | 7/1985 | Wiegel |
| 4,695,246 | A | 9/1987 | Beilfuss et al. |
| 4,745,300 | A | 5/1988 | Kammerer et al. |
| 4,806,843 | A | 2/1989 | Mertens et al. |
| 4,842,510 | A | 6/1989 | Grunden et al. |
| 4,872,828 | A | 10/1989 | Mierzwinski et al. |
| 4,948,044 | A | 8/1990 | Cacciatore |
| 4,955,806 | A | 9/1990 | Grunden et al. |
| 4,979,066 | A * | 12/1990 | Kawata ..................... G05F 1/66 323/276 |
| 5,025,134 | A | 6/1991 | Bensoussan et al. |
| 5,081,411 | A | 1/1992 | Walker |
| 5,138,177 | A * | 8/1992 | Morgan ............... H03K 17/163 250/551 |
| 5,158,477 | A | 10/1992 | Testa et al. |
| 5,175,439 | A | 12/1992 | Harer et al. |

(Continued)

FOREIGN PATENT DOCUMENTS

| CA | 1035448 A | 7/1978 |
| FR | 2491692 A | 4/1982 |

*Primary Examiner* — Dinh T Le

(57) ABSTRACT

A switch controller, an isolated system incorporating an integrated circuit (IC) and a method of operating a power switch. In one embodiment, the IC includes: (1) a monolithic substrate, (2) a drive circuit supported by the monolithic substrate and configured to drive a power switch, (3) a diagnostics block supported by the monolithic substrate and configured to provide diagnostic signals indicating at least one attribute associated with the power switch and (4) a control block supported by the monolithic substrate and configured to drive the drive circuit in response to control signals developed based on the diagnostic signals.

23 Claims, 10 Drawing Sheets

(56) References Cited

U.S. PATENT DOCUMENTS

| | | |
|---|---|---|
| 5,192,874 A | 3/1993 | Adams |
| 5,255,179 A | 10/1993 | Zekan et al. |
| 5,277,244 A | 1/1994 | Mehta |
| 5,347,982 A | 9/1994 | Binzer et al. |
| 5,506,569 A | 4/1996 | Rowlette |
| 5,579,197 A | 11/1996 | Mengelt et al. |
| 5,611,484 A | 3/1997 | Uhrich |
| 5,635,896 A | 6/1997 | Tinsley et al. |
| 5,697,552 A | 12/1997 | McHugh et al. |
| 5,736,795 A | 4/1998 | Zuehlke et al. |
| 5,903,139 A * | 5/1999 | Kompelien ............ H02M 5/293 307/39 |
| 5,975,374 A | 9/1999 | Bias et al. |
| 6,060,719 A | 5/2000 | DiTucci et al. |
| 6,084,518 A | 7/2000 | Jamieson |
| 6,222,719 B1 | 4/2001 | Kadah |
| 6,275,160 B1 | 8/2001 | Ha |
| 6,356,038 B2 | 3/2002 | Bishel |
| 6,490,174 B1 | 12/2002 | Kompelien |
| 6,509,838 B1 | 1/2003 | Payne et al. |
| 6,566,768 B2 | 5/2003 | Zimmerman et al. |
| 6,657,418 B2 | 12/2003 | Atherton |
| 6,743,010 B2 | 6/2004 | Bridgeman et al. |
| 6,794,771 B2 | 9/2004 | Orloff |
| 6,886,754 B2 | 5/2005 | Smith et al. |
| 7,291,940 B2 * | 11/2007 | Bruwer ................ H01H 13/063 307/137 |
| 7,304,828 B1 * | 12/2007 | Shvartsman ........... H02H 3/085 361/93.1 |
| 7,476,988 B2 | 1/2009 | Mulhouse et al. |
| 7,772,924 B2 * | 8/2010 | Matamura ............. H03F 3/2173 330/10 |
| 2003/0064333 A1 | 4/2003 | Canon |
| 2003/0231001 A1 | 12/2003 | Bruning |
| 2004/0209209 A1 | 10/2004 | Chodacki et al. |
| 2008/0043393 A1 * | 2/2008 | Petkov ................... H02H 5/041 361/103 |

* cited by examiner

CIRCUITS AND METHODS FOR PROVIDING POWER AND DATA COMMUNICATION IN ISOLATED SYSTEM ARCHITECTURES

CROSS-REFERENCE TO RELATED APPLICATION

This application is related to U.S. patent application Ser. No. 14/814,368, filed by Teggatz, et al., on Jul. 30, 2015, entitled "Power Sharing Solid-State Relay," commonly assigned with this application and incorporated herein by reference.

TECHNICAL FIELD

This application is directed, in general, to isolated system architectures and, more specifically, to the provision of power and data communication within such isolated system architectures.

BACKGROUND

Solid state relays provide a more reliable and faster means to switch loads on and off in a secondary region. When compared to mechanical relays, solid state relays have a much longer cycle life and can turn loads on and off much faster. One of the challenges with solid state relays is that they require a constant charge on the control gate. As such, this constraint requires the control circuit to be constantly operating, which can reduce the battery life when the control circuit is a portable device, as is often the case when a separate power source is not provided for the control circuit.

Many conventional solid state relays use a capacitor to isolate its solid state switches from the primary side to the secondary side. In 24-volt alternating current (VAC) systems, the ground line is not available, and only the VAC line (common) and the load lines are available. Because there is no ground line, there is no robust supply path on the secondary side. Therefore, the power to charge the gates of the switches is provided by continuously clocking the isolating capacitor that is tied to the solid-state relay. This continued clocking consumes continuous power from the primary side. In many cases, the primary side is battery powered, and therefore, the battery power is consumed.

Solid-state relays can be used for driving 24 VAC systems, including but not limited to heating, ventilation and air conditioning (HVAC) control systems, security systems, smoke detector systems, water sprinkler control systems and pool control systems. These systems can be configured to use isolated and non-isolated power systems. Because there is no supply and ground line located at the secondary side of the solid state relay, energy can be alternatively received by rectifying the energy across the common line and a load line using a diode bridge or other suitable circuits. When a switch is in the off position, the diode bridge can provide energy across the rectifier. A problem with this architecture is that if too much load current is drawn in the off-state switch, the load can inadvertently turn on, because the load current threshold for switching on the load is met. This is undesirable and can cause the system to work in an incorrect manner. Alternatively, energy transfer across a rectifier or other suitable power converter can be limited to occur only when the switch is in the off-state. Therefore, when the switch is in the on-state, energy will not be transferred across the rectifier.

SUMMARY

One aspect provides a switch controller. In one embodiment, the switch controller includes: (1) a monolithic substrate, (2) a drive circuit supported by the monolithic substrate and configured to drive a power switch, (3) a diagnostics block supported by the monolithic substrate and configured to provide diagnostic signals indicating at least one attribute associated with the power switch and (4) a control block supported by the monolithic substrate and configured to drive the drive circuit in response to control signals developed based on the diagnostic signals.

Another aspect provides an isolated system. In one embodiment, the isolated system includes: (1) a monolithic substrate, (2) first and second gate drive circuits supported by the monolithic substrate and configured to drive respective first and second power transistors, (3) a control block supported by the monolithic substrate and configured to drive the first and second gate drive circuits in response to control signals developed based on the diagnostic signals and (4) a microcontroller coupled to the control block and configured to receive the diagnostic signals and provide the control signals.

Yet another aspect provides a method of operating a solid-state relay. In one embodiment, the method includes: (1) driving the power switch with a drive circuit, (2) providing diagnostic signals indicating at least one attribute associated with the power switch and (3) driving the drive circuit in response to control signals developed based on the diagnostic signals to sample power from a power bus coupled to the drive circuit.

BRIEF DESCRIPTION

Reference is now made to the following descriptions taken in conjunction with the accompanying drawings, in which.

DETAILED DESCRIPTION

The terminology used herein is for the purpose of describing particular examples and is not intended to be limiting of the disclosed subject matter. Like reference numbers refer to like elements throughout the specification. As used herein the term "and/or" includes any combination of one or more of the associated listed items. Also, as used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Also, as used herein, relational terms such as first and second, top and bottom, left and right, and the like may be used to distinguish one entity or action from another entity or action without necessarily requiring or implying any actual such relationship or order between such entities or actions.

As described in the Background above, the power conventional solid-state relays require to remain in an on-state is either provided from the (often battery-powered) primary side or from the secondary side. However, the latter is available only when the relays are in an off-state. Disclosed in the related application referred to above and incorporated herein is a solid-state relay architecture that can obtain its own power from the secondary circuit power source.

Introduced herein are various embodiments of circuits and methods for providing power and data communication in isolated system architectures. The various embodiments employ solid-state relay architectures and isolation circuits in the context of systems in which some form of isolation exists. Some embodiments of the solid-state relay architectures have enhanced diagnostics and control capability. Other embodiments share external control or data buses to effect operation in parallel. Still other embodiments allow data to be communicated to overarching networks, allowing the Internet of Things (IoT) to encompass endpoints that exist in electrically isolated systems.

Figure 1:
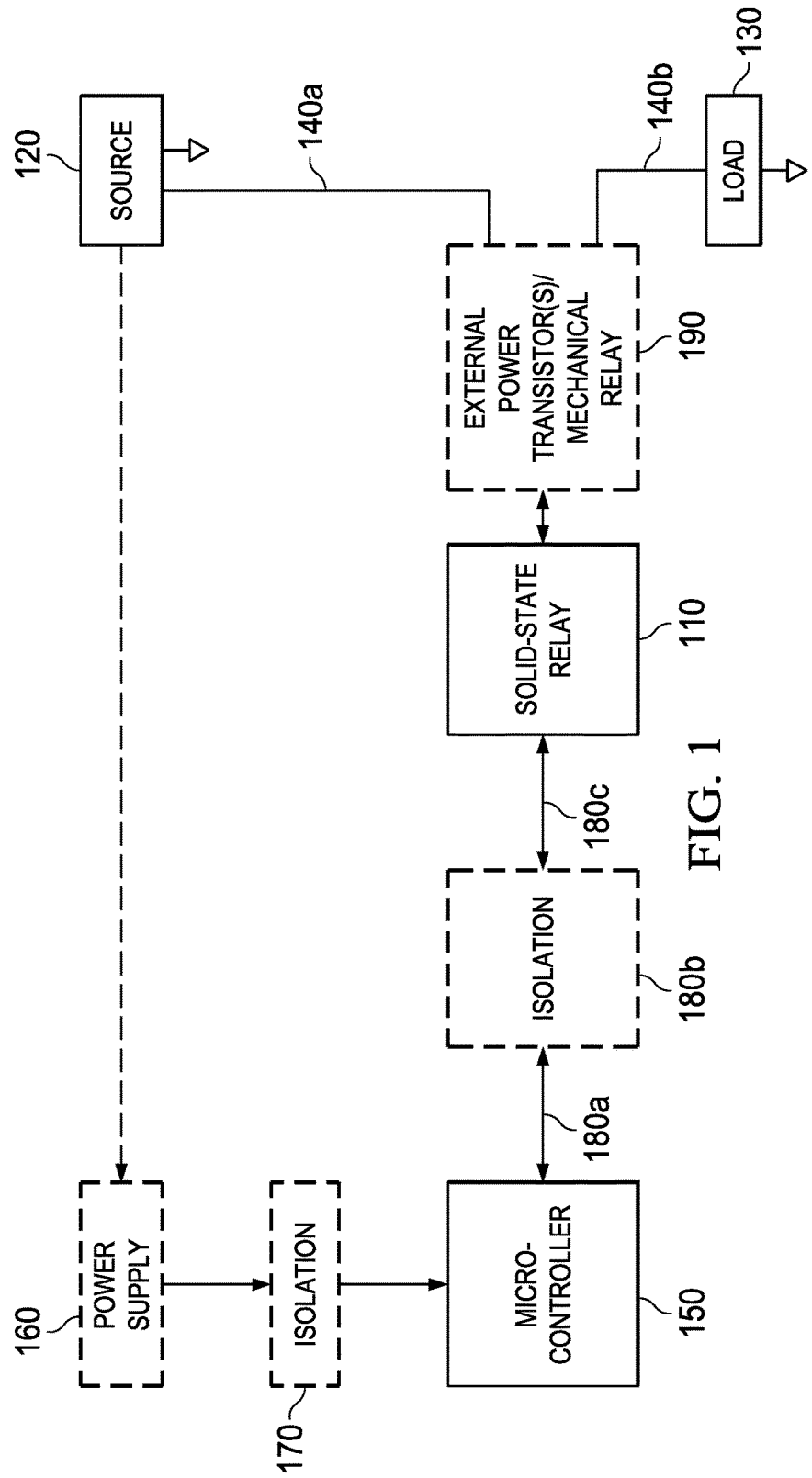
FIG. 1 is a high-level block diagram of one embodiment of a system including a solid-state relay.

Various system architectures will now be described with reference to a high-level block diagram in which solid lines designate components that exist in most, if not all, embodiments and broken lines indicate components that exist in some, but not all, embodiments. FIG. 1 is a high-level block diagram of one embodiment of a system including a solid-state relay 110.

A solid-state relay is a relay that uses one or more solid-state devices as its power switches and uses a switch controller to drive the one or more solid-state devices. The solid-state relay embodiments described herein generally employ field-effect transistors (FETs) as their power switches. However, those skilled in the art will understand that the circuits described herein may be employed to drive mechanical power switches, such as conventional relays, as well as solid-state power switches, such as conventional bipolar transistors, insulated-gate bipolar transistors (IGBTs), triacs and thyristors.

The solid-state relay 110 is employed to conduct electric power from a source 120 to a load 130 via a power bus 140a, 140b intermittently, that is, selectively in response to an on/off control signal generated by a microcontroller (e.g., a microcontroller 150) based on one or more stimuli or conditions of some sort. A data bus 180a, 180c, bears the control signal between the microcontroller 150 and the solid-state relay 110.

For example, if the architecture of FIG. 1 is employed in the context of an HVAC system, the solid-state relay 110 and microcontroller 150 may be located in a thermostat, the source 120 may be a 220 volt AC power source, and the load 130 may be a refrigerant compressor 130. The control signal may be based on the temperature of a room being conditioned. If the architecture of FIG. 1 is employed in a production line, the microcontroller 150 may be located in a control box, the source 120 may be a 110 volt AC power source, the load 130 may be a motor driving a conveyor belt, and the solid-state relay 110 may be mounted on the motor casing. The control signal may be based on a whether the production line is running or idle.

In certain embodiments, a power supply 160 may provide power to the microcontroller. The power supply 160 may derive its power from the source 120 or another source (not shown). Basic galvanic isolation may be provided by a circuit 170 between the power supply 160 and the microcontroller 150. In some embodiments, the circuit 170 takes the form of a transformer. In other embodiments, the circuit 170 takes the form of a capacitor.

Figure 5:
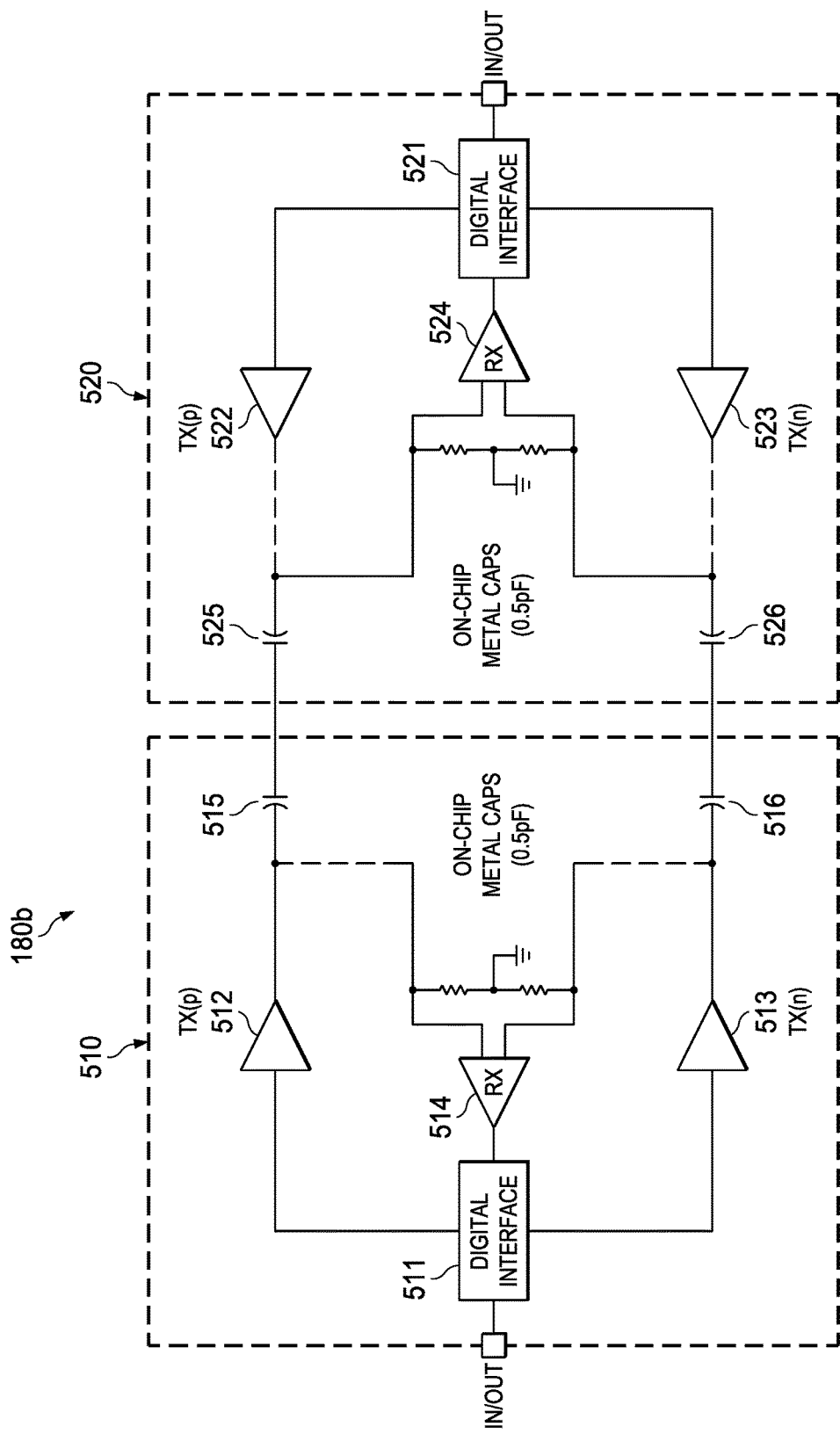
FIG. 5 is a block diagram of one embodiment of a circuit for providing bidirectional data communication between two isolated domains.

In certain embodiments, an isolation circuit 180b is provided in the data bus that bears communication between the microcontroller 150 and the solid-state relay 110. In the embodiments described herein, the isolation circuit 180b is different from the isolation circuit 170 in that the isolation circuit 180b allows digital data communication to take place across it. In most embodiments, the communication is bidirectional. One embodiment of such circuit is shown in FIG. 5 and will be described below.

In certain embodiments, the solid-state relay 110 does not directly conduct the electric power from the source 120 to the load 130, but instead drives one or more external power transistors or a mechanical relay 190 that, in turn conducts the electric power from the source 120 to the load 130. In various embodiments to be illustrated and described herein, the switch controller of the solid-state relay 110 is embodied on a monolithic substrate (e.g., composed of silicon). Some of the embodiments include the power transistors on the substrate as well; other of the embodiments provide control terminals on the substrate that may be coupled to the gate or gates of one or more external power transistors or the control input of a mechanical relay. The terms "switch controller" and "solid-state relay" may be sometimes used interchangeably herein, though the latter term often includes the power switch(es) controlled by the switch controller.

While FIG. 1 shows a single solid-state relay 110, a single load 130 and a single microcontroller 150, various embodiments will be described herein that employ multiple solid-state relays 110 to control corresponding multiple loads 130, typically from a common power bus 140a. Some embodiments use multiple microcontrollers 150 operating either in parallel or in a primary-secondary configuration. Other embodiments use a single microcontroller 150 to provide common control of multiple solid-state relays 110. In the latter case, isolation, if provided, may be shared between or among multiple solid-state relays 110 or unique to each one of the multiple solid-state relays, depending upon where the isolation circuit 180b is provided in the data bus 180a, 180c that couples them.

Those skilled in the pertinent art will understand that most components of the architectures illustrated in FIG. 1 are embodied in hardware, while some components may include software or firmware. More particularly, many embodiments of the solid-state relay 110 and the microcontroller include software or firmware that contributes to their functionality.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

Figure 2:
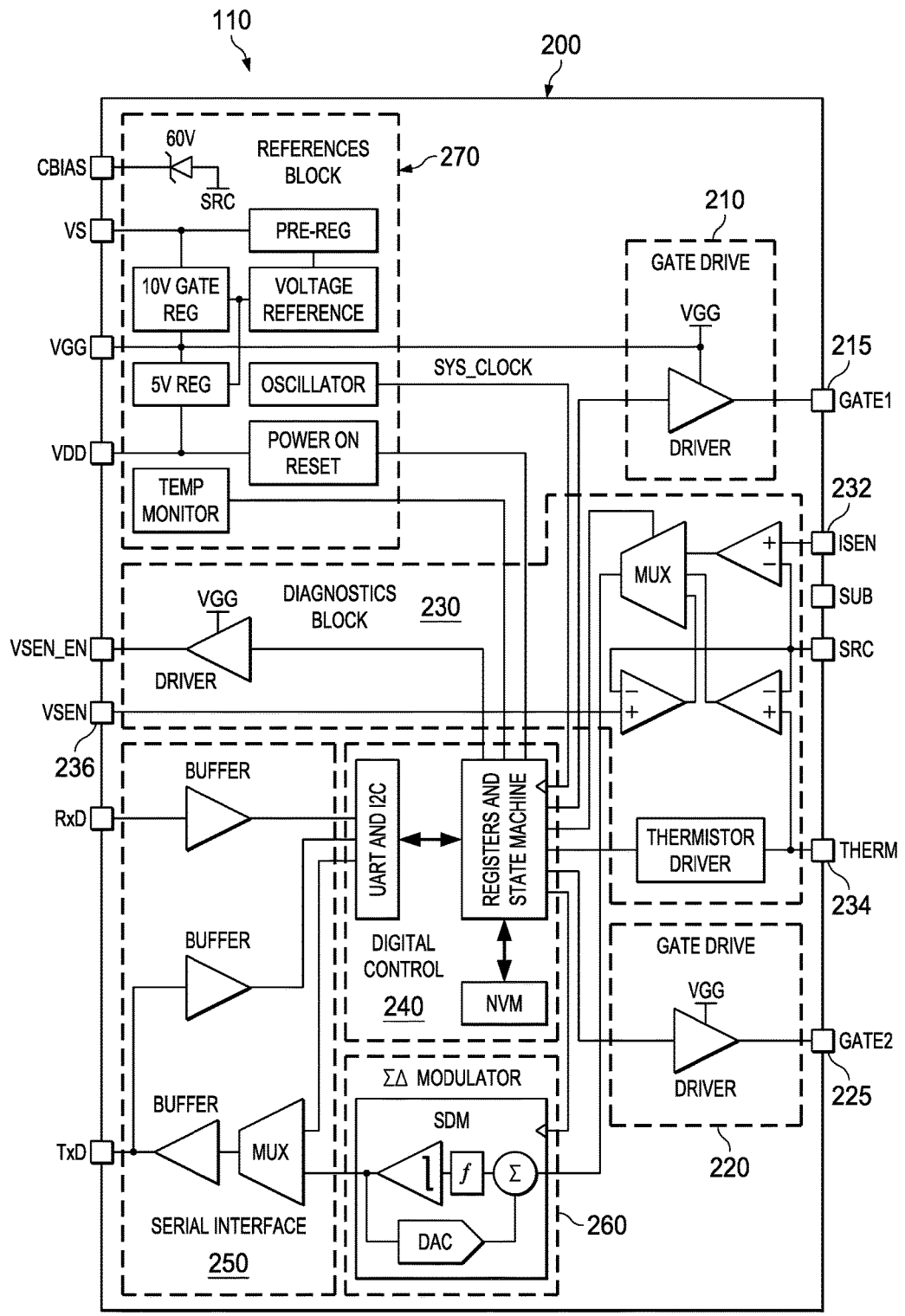
FIG. 2 is a block diagram of one embodiment of a solid-state relay for use with external power transistors and having an enhanced diagnostics and control capability.

FIG. 2 is a block diagram of one embodiment of a solid-state relay 110 for use with external power transistors and having an enhanced diagnostics and control capability. The solid-state relay 110 takes the form of an IC located on or in a monolithic substrate 200. The solid-state relay 110 includes a first gate drive circuit 210 and a second gate drive circuit 220. The first and second gate drive circuits 210, 220 are supported by the monolithic substrate 200. The first and second gate drive circuits 210, 220 are configured to drive respective first and second transistors (not shown in FIG. 2) via respective first and second gate drive output terminals GATE 1 and GATE2 215, 225.

The solid-state relay 110 also includes a diagnostics block 230 supported by the monolithic substrate 200. The diagnostics block 230 is configured to provide diagnostic signals indicating at least a current associated with the solid-state relay 110 (e.g., passing through the power transistors driven by the solid-state relay 110 embodiment of FIG. 2). A current sense input terminal ISEN 232 is coupled to a conventional current sensor (not shown) for this purpose. The diagnostics block 230 of FIG. 2 is further configured to provide diagnostic signals indicating a temperature (e.g., a temperature of the load 130 of FIG. 1) using a temperature sense input terminal THERM 234. The diagnostics block 230 of FIG. 2 is further configured to provide diagnostic signals indicating a voltage of the power bus to which the solid-state relay 110 is coupled (e.g., coupled to the power transistors driven by the solid-state relay 110 embodiment of FIG. 2). A voltage sense input terminal VSEN 236 is provided for this purpose. As those skilled in the pertinent art understand, current, temperature and voltage may be analyzed to identify problems that may be arising, e.g., regarding the supply (120 of FIG. 1) or a load (130 of FIG. 1). For example, a load that is in the process of failing may exhibit an increased current draw and temperature that is not in response to an increased power bus voltage.

An unreferenced multiplexer in the diagnostics block 230 may be employed to select a particular one of the various diagnostic signals to communicate externally (i.e. to a microcontroller 150). The multiplexer is shown as being under the control of a control block 240.

The control block 240 is configured to drive the first and second gate drive circuits 210, 220 in response to control signals developed based on the diagnostic signals and control signals received via a serial interface 250 in the embodiment of FIG. 2. In the illustrated embodiment, the control block 240 is a digital control block. In alternative embodiments, the control block 240 is an analog or mixed-signal control block.

A sigma-delta modulator 260 is coupled to the serial interface 250 and configured to convert the diagnostic signals to digital data for transmission by the serial interface 250. The control block 240 embodiment includes an unreferenced controller having registers and a state machine, non-volatile memory (NVM) and a universal asynchronous receive transmit and I2C serial bus interface. As those skilled in the art understand, an I2C serial bus has a data line and a clock line. Alternative embodiments employ other conventional or later-defined, standard interfaces. The buses to which those interfaces connect may be non-isolated or may be isolated using capacitors or any alternative isolating component.

Those skilled in the art will understand that since bidirectional communication is possible, remote control of the solid-state relay 110 is possible beyond the microcontroller itself. In fact, the solid-state relay 110 may be remotely controlled wirelessly or by wireline in various embodiments using a variety of conventional or later-developed devices, such as cell phones and computers.

The solid-state relay 110 also includes a references block 270 supported by the monolithic substrate 200. The references block 270 is configured to generate at least one reference signal for use by the solid-state relay 110. The references may include a voltage reference, a local oscillator reference and a reference temperature (ambient with respect to the solid-state relay 110). The "health" of the solid-state relay 110 itself may be monitored using this feature.

In the illustrated embodiment, the solid-state relay 110 only uses current when active to minimize power consumption. In this manner excess power losses are avoided. Two different alternatives for powering the microcontroller 150 are illustrated in FIGS. 3 and 4, first in which the power bus (140a, 140b of FIG. 1) provides the power, and next in which the power is derived from elsewhere.

In considering the embodiment of FIG. 2, those skilled in the pertinent art will understand the following. First, the resistance, voltage and current-handling capabilities of the solid-state relay 110 may be adapted by changing the characteristics of the power switches that it drives. Thus, one IC design may be employed in a variety of applications. Second, the power switches may be integrated into the IC, which reduces the number of applications that the IC may accommodate, but reduces the complexity of the circuitry that surrounds the IC in a given application. Some embodiments of the solid-state relay 110 provide additional current monitoring by monitoring both conductors of the power bus (140*a*, 140*b* of FIG. 1). This enables ground-fault monitoring or arc-fault monitoring, which is useful in many applications.

Figure 3:
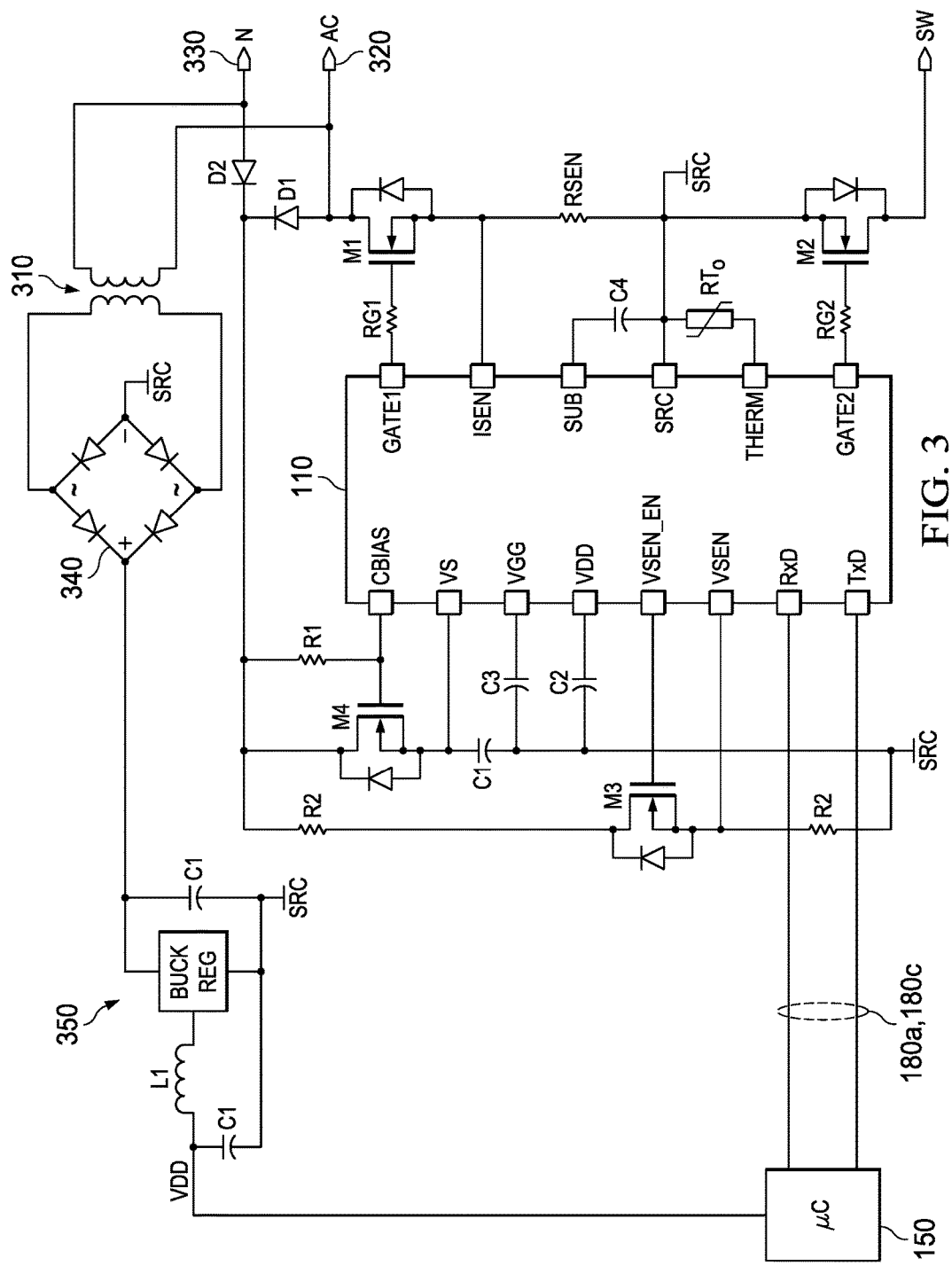
FIG. 3 is a block diagram of the solid-state relay of FIG. 1 and associated microcontroller used in a non-isolated system.

FIG. 3 is a block diagram of the solid-state relay 110 of FIG. 1 and associated microcontroller 150 used in a non-isolated system. As stated above, the microcontroller 150 may be powered by the power bus (140*a*, 140*b* of FIG. 1). Accordingly, an isolation component (i.e. a transformer 310) is coupled to AC and neutral conductors 320, 330 of the power bus. A bridge rectifier 340 rectifies the AC power, and a voltage regulator 350 regulates the rectified AC power, providing it to the microcontroller 150. The microcontroller 150 then controls the solid-state relay 110 to derive power from the power bus using one of the AC power sampling techniques described herein. An isolated data bus 180*a* is not needed.

Figure 4:
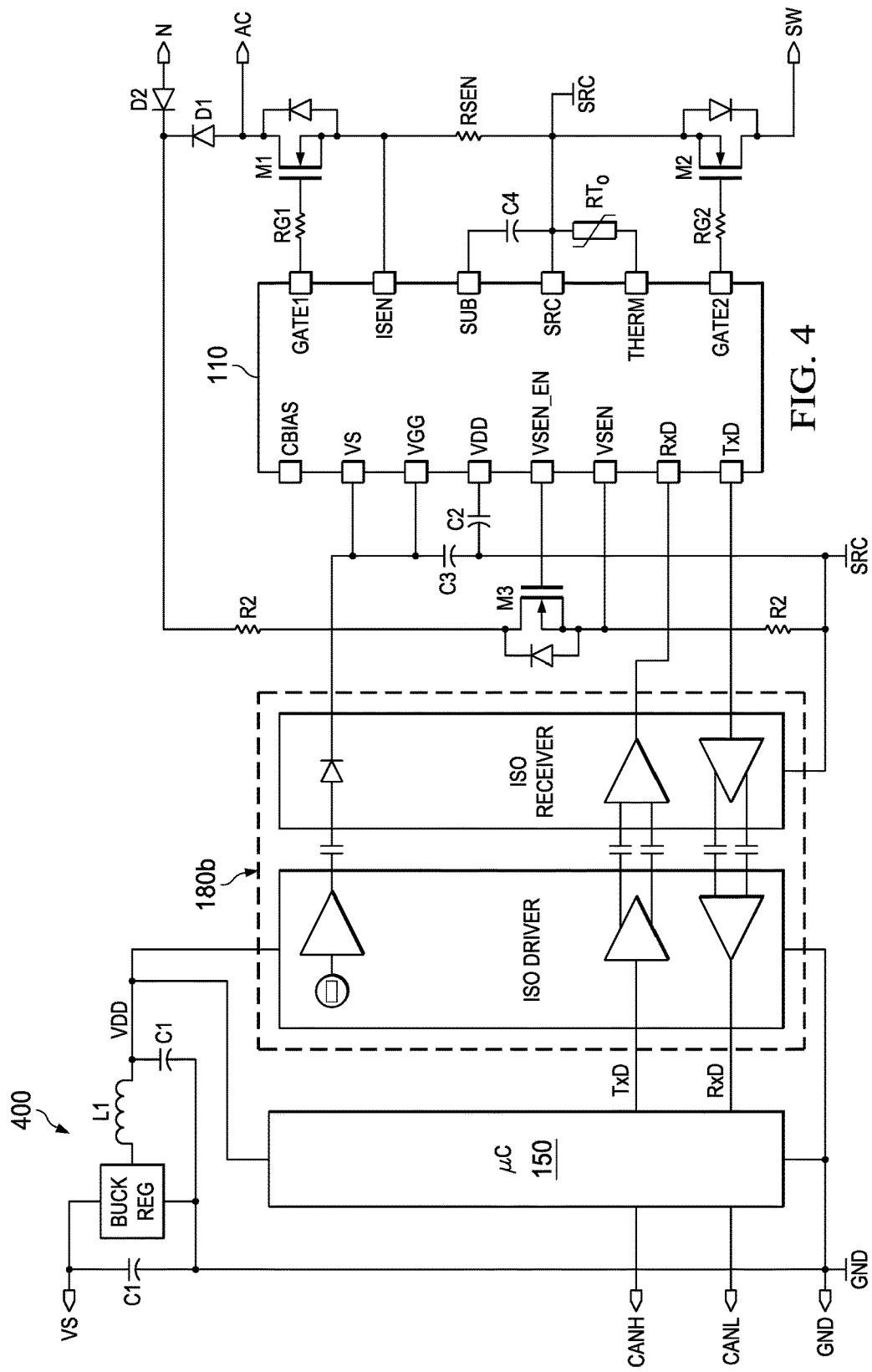
FIG. 4 is a block diagram of the solid-state relay of FIG. 1 and associated microcontroller used in an isolated system powered from an external power supply.

FIG. 4 is a block diagram of the solid-state relay 110 of FIG. 1 and associated microcontroller 150 used in an isolated system powered from an external power supply. As stated above, the microcontroller 150 may alternatively be powered by other than the power bus (140*a*, 140*b* of FIG. 1), relieving the power bus of the load the microcontroller 150 represents. In the embodiment of FIG. 4, a voltage regulator 400 regulates power received from a source other than the source 120 of FIG. 1, providing it to the microcontroller 150. The voltage regulator 400 also provides power to isolation circuit 180*b*. The isolation circuit 180*b* is required in the embodiment of FIG. 4, since the microcontroller 150 is in a different power domain from the solid-state relay 110.

Transistors M1 and M2 can represent an array of transistors that can be scaled to meet the requirements of load current, voltage, power dissipation capability, or any other parameter. In one embodiment, transistors M1 and M2 can also have their gates driven by separate drivers such that only an appropriate number of transistors in the array need to be driven according to load current, thereby reducing switching losses in pulse-width modulation (PWM) applications.

Transistors M1 and M2 can represent an array of different types of switches, which could even be a combination of solid-state devices and mechanical devices. For applications in which a wide range of load currents or system voltages must be supported, different types of switches could be used with separate drive circuits (not shown), allowing the system to choose the appropriate switching device for the level of load current to be supported.

FIG. 5 is a block diagram of one embodiment of a circuit for providing bidirectional data communication between two isolated domains. The circuit may be the isolation circuit 180*b* of FIGS. 1 and 4. The circuit employs two separate substrates 510, 520 (corresponding to the two domains) to ensure that the two domains remain galvanically isolated from one another. The substrate 510 includes an input/output terminal IN/OUT, a digital interface 511 coupled to the input/output terminal IN/OUT, a positive-rail driver 512 coupled to the digital interface 511, a negative-rail driver 513 coupled to the digital interface 511, a receiver 514 coupled to the digital interface 511, a positive-rail capacitor 515 coupled to the positive-rail driver 512 and a negative-rail capacitor 516 coupled to the negative-rail driver 513. Likewise, the substrate 520 includes an input/output terminal IN/OUT, a digital interface 521 coupled to the input/output terminal IN/OUT, a positive-rail driver 522 coupled to the digital interface 521, a negative-rail driver 523 coupled to the digital interface 521, a receiver 524 coupled to the digital interface 521, a positive-rail capacitor 525 coupled to the positive-rail driver 522 and a negative-rail capacitor 526 coupled to the negative-rail driver 523. The positive-rail capacitors 515, 525 are coupled to one another, and the negative-rail capacitors 516, 526 are coupled to one another.

The circuit is configured for bidirectional operation by switching the drivers and receivers. As shown, the circuit is configured for transmission from left to right as shown. Thus, the datapath is from the leftmost input/output terminal IN/OUT, to the digital interface 511, to the positive-rail and negative-rail drivers 512, 513, to the positive-rail and negative-rail capacitors 515, 516, 525, 526, to the receiver 524, to the digital interface 521 and to the rightmost input/output terminal IN/OUT. Broken lines indicate portions of the datapath in the opposite direction.

Those skilled in the pertinent art will understand that, for communication across the isolation barrier, data is driven differentially across separate capacitors. One capacitor is driven with a rising voltage, and the other is driven with a falling voltage. A hysteretic comparator on the receiver decodes the differential signal and provides a logic-level output. In the illustrated embodiment, the input to the receiver is weakly pre-biased to 0V to maximize the incoming signal.

As FIG. 5 shows, the positive-rail capacitors 515, 525 and the negative-rail capacitors 516, 526 are implemented on their respective substrates. The positive-rail capacitors 515, 525 and the negative-rail capacitors 516, 526 are coupled in series, allowing the circuit as a whole to stand-off twice as much voltage as it could were only one capacitor to be used. In one embodiment, each capacitor is formed between M1 (the lowest level of metal) and RDL (the top layer of metal) with the number of metals in between being chosen to increase the separation between M1 and RDL to yield sufficient breakdown voltage.

Figure 6:
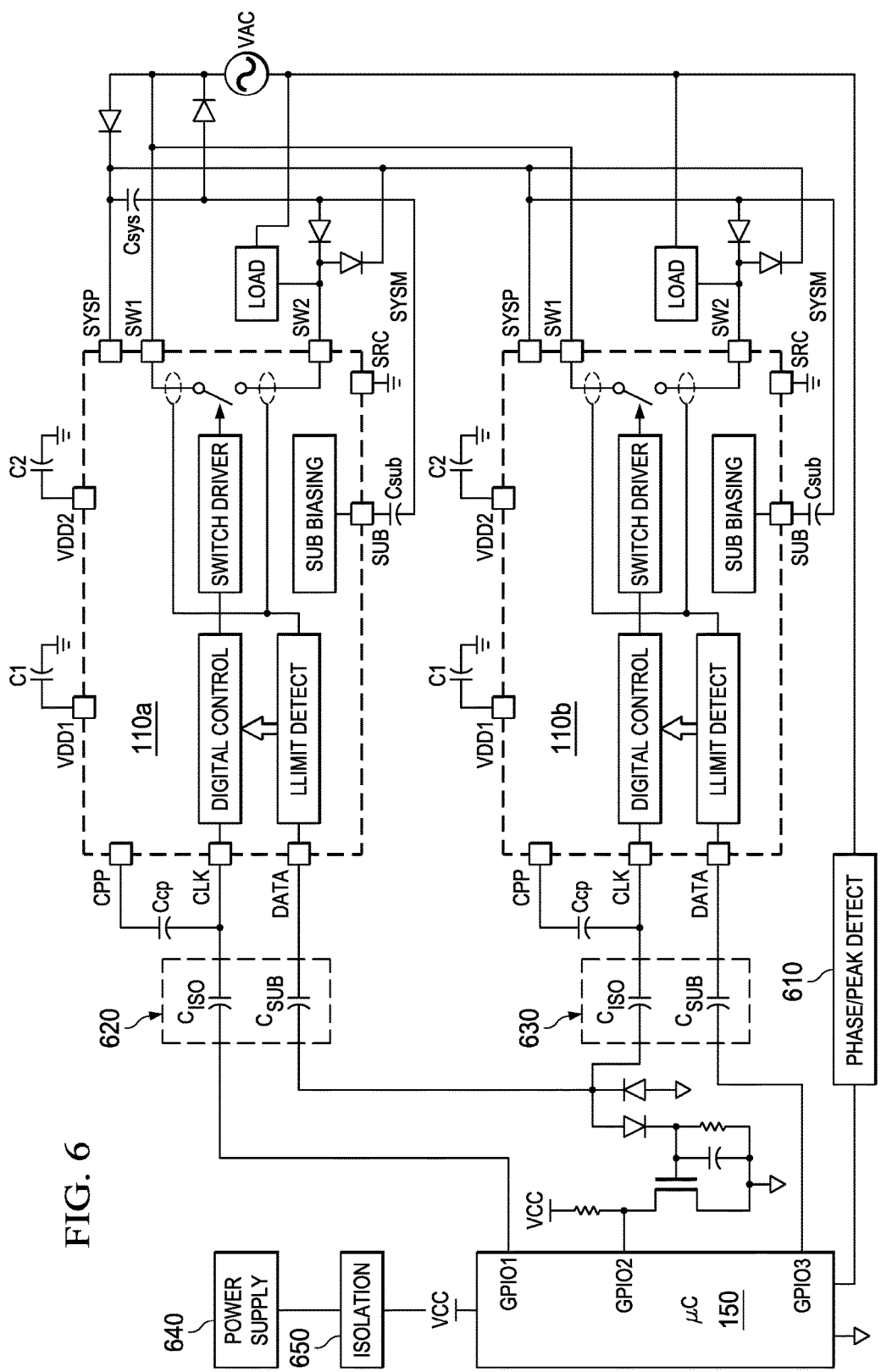
FIG. 6 is a block diagram of multiple solid-state relays and an associated microcontroller in which the microcontroller controls the manner in which the solid-state relays are powered.

FIG. 6 is a block diagram of multiple solid-state relays 110*a*, 110*b* and an associated microcontroller 150 in which the microcontroller 150 controls the manner in which the solid-state relays 110*a*, 110*b* are powered. As stated above and described in detail in the related application incorporated by reference herein, a microcontroller is employed to control the power switches associated with a solid-state relay to derive power from the AC power bus switched by the solid-state relay. In the context of FIG. 6, a single microcontroller 150 is able to control both solid-state relays 110*a*, 110*b* to derive power from an AC power bus (i.e. the power bus 140*a*, 140*b* of FIG. 1). To this end, FIG. 6 illustrates a phase/peak detector 610 configured to allow the microcontroller 150 to sense the phase (and the peak voltage) of the AC waveform on the power bus in order to determine times at which to switch the solid-state relays 110*a*, 110*b* to derive the power they need to operate. Since the microcontroller 150 is controlling multiple solid-state relays 110*a*, 110*b*, the microprocessor may employ a dithering technique to ensure that both solid-state relays 110*a*, 110*b* are not attempting to derive power from the power bus simultaneously. The phase/peak detector 610 allows an efficient dithering function with either inductive or non-inductive loads.

In the illustrated embodiment, dithering is achieved by monitoring the voltage on the power bus. When the voltage it drops below a low-voltage threshold, the power switches associated with a particular solid-state relay are turned off briefly.

It should also be noted in FIG. 6 that the serial bus coupling the microcontroller 150 to the solid-state relays 110*a*, 110*b* employs one set of isolating capacitors 620 for the solid-state relay 110a and a separate set of isolating capacitors 630 for the solid-state relay 110b. It should also be noted that a separate power supply 640 powers the microcontroller 150 via an isolation circuit 650.

Figure 7:
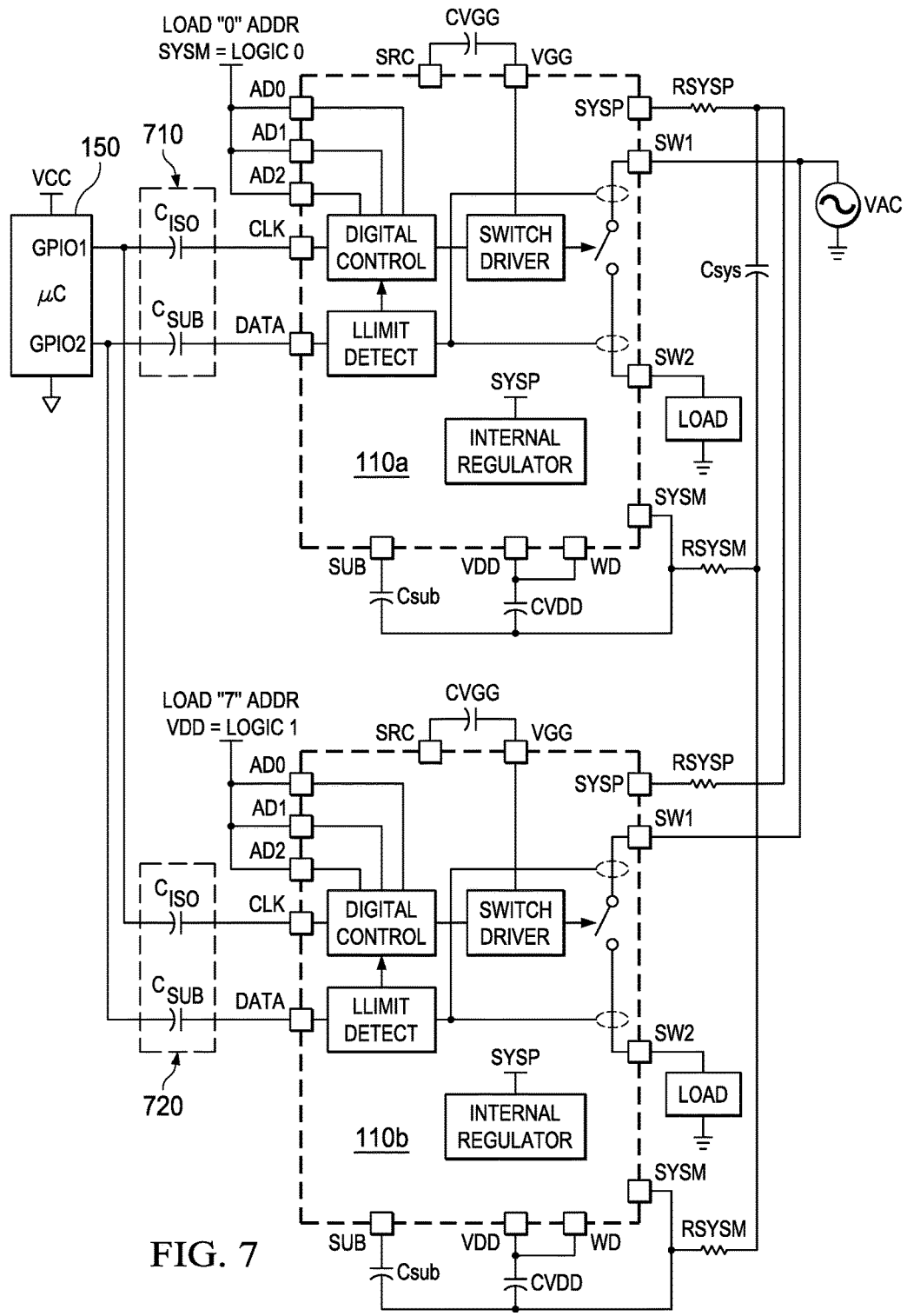
FIG. 7 is a block diagram of multiple solid-state relays and an associated microcontroller in which the solid-state relays and microcontroller are coupled by a common, isolated data bus.

FIG. 7 is a block diagram of multiple solid-state relays and an associated microcontroller in which the solid-state relays and microcontroller are coupled by a common, isolated data bus. FIG. 7 is presented for two purposes. First, address lines AD0, AD1, AD2 are shown. The address lines AD0, AD1, AD2 allow the microcontroller 150 to address the solid-state relays 110a, 110b individually. Those skilled in the pertinent art will understand that three address lines allow the microcontroller 150 to address up to eight different solid-state relays. Alternative embodiments provide fewer or more address lines to accommodate any number of solid state relays that may be employed in a given application. Second, while capacitors 710, 720 are shown for each of the solid-state relays 110a, 110b, they may be shared by locating them proximate the microcontroller 150. This configuration reduces the number of capacitors required for isolation to one for each line of the data bus.

Various modes of operation by which power may be derived (or harvested) from the power bus to power a solid-state relay will now be described. Three modes of operation will now be described in detail: a timed sampling mode, a triggered sampling mode and a waveform capture mode.

Figure 8:
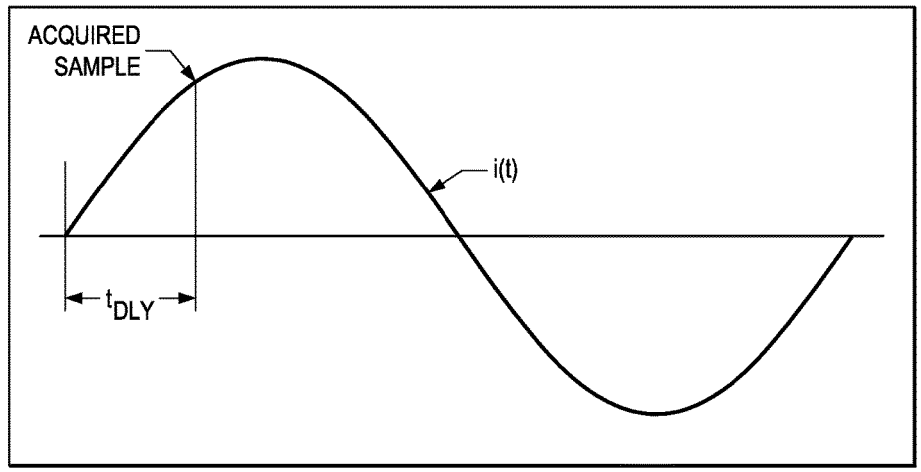
FIG. 8 is a diagram of one cycle of an AC waveform showing timed sampling of AC power.
Figure 9:
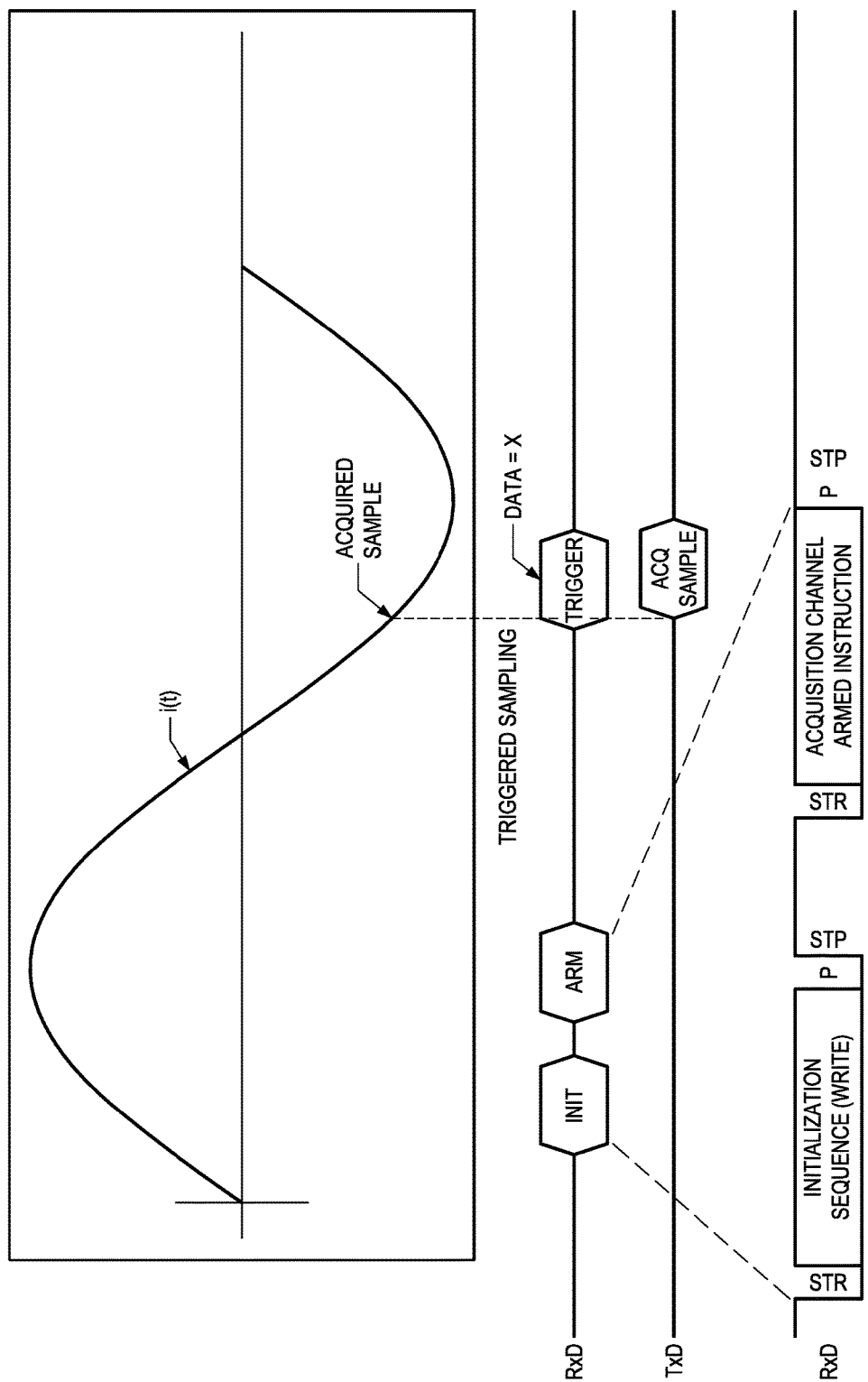
FIG. 9 is a diagram of one cycle of an AC waveform showing triggered sampling of AC power.

FIG. 8 is a diagram of one cycle of an AC waveform showing timed sampling of AC power. FIG. 9 is a diagram of one cycle of an AC waveform showing triggered sampling of AC power. In both FIGS. 8 and 9, the cycle is expressed as current i(t).

In FIG. 8, sampling occurs following a delay time $t_{DLY}$ after a zero-crossing. The delay time, $t_{DLY}$, is programmed in a register. An acquired current sample is reported in another register. The mode may be programmed autonomously to send the sample via the serial interface upon the acquisition of the sample, or to hold the sample in the register until it is read by request of the microcontroller.

In FIG. 9, sampling occurs on the edge of the next start bit. Upon receipt of the next start bit, the power bus is sampled. This sample is immediately transmitted from the serial interface unless the serial interface is busy sending other data. In this case, the sampled data will be sent as soon as the data transmit buffer associated with the data bus is empty.

In the waveform capture mode, the waveform on the power bus is sampled periodically every at a sample interval of $t_{DLY}$. The results of these samples are buffered and transmitted serially in sequence until a command to stop has been received. In one embodiment, the samples are streamed out only for one-half cycle. In an alternative embodiment, the samples are streamed out over a whole cycle, triggered on a zero crossing.

Figure 10:
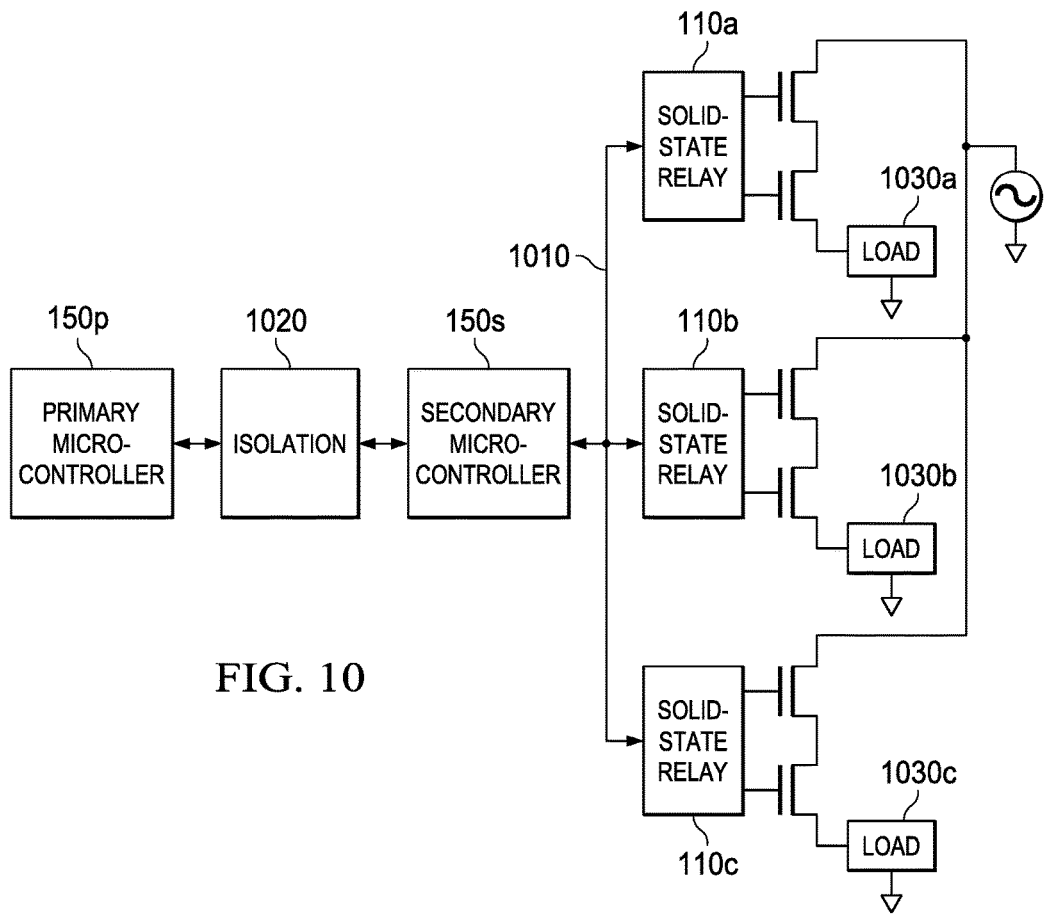
FIG. 10 is a block diagram of multiple solid-state relays and associated primary and secondary microcontrollers in which the solid-state relays and secondary microcontroller are coupled by a common, isolated data bus.

FIG. 10 is a block diagram of multiple solid-state relays 110a, 110b, 110c and associated primary and secondary microcontrollers 150p, 150s in which the solid-state relays 110a, 110b, 110c and secondary microcontroller 150s are coupled by a common, isolated data bus 1010. Each of the solid-state relays 110a, 110b, 110c has a corresponding load 1030a, 1030b, 1030c.

FIG. 10 is presented primarily for the purpose of showing that multiple solid-state relays 110a, 110b, 110c may be placed in a unitary package with a controller (i.e. the secondary controller 150s). In one embodiment, the solid-state relays 110a, 110b, 110c, the secondary controller and the data bus 1010 are embodied in a single IC on a common substrate. The secondary microcontroller 150s may be used to capture and process data from the solid-state relays 110a, 110b, 110c and then send the captured and processed data to the primary microcontroller 150p. Optionally, the primary microcontroller 150p may be isolated from the secondary controller 150s using isolation circuitry (e.g., the isolation circuit 180b of FIGS. 1 and 5).

Figure 11:
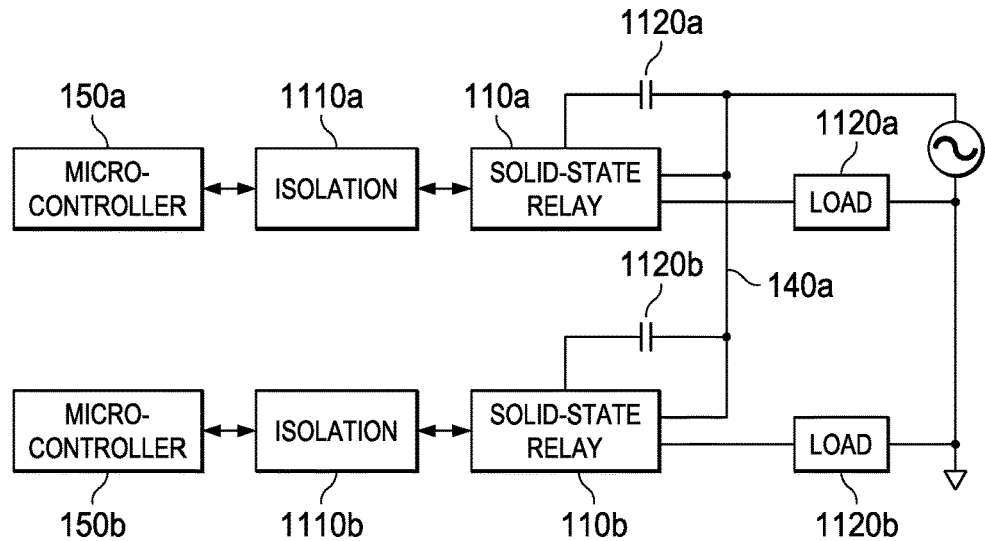
FIG. 11 is a block diagram of multiple solid-state relays and corresponding microcontrollers in which a secondary power bus bears data communication between the solid-state relays and microcontrollers.

FIG. 11 is a block diagram of multiple solid-state relays 110a, 110b and corresponding microcontrollers 150a, 150b in which a secondary power bus bears data communication between the solid-state relays 110a, 110b and the microcontrollers 150a, 150b. Isolation circuits 1110a, 1110b may be located between the solid-state relays 110a, 110b and the microcontrollers 150a, 150b.

FIG. 11 is presented primarily for the purpose of showing that magnetic or capacitive coupling components (i.e. capacitors 1120a, 1120b) can be added to the power bus 140a to enable power line communication. Transceivers (not shown) on the power bus can be addressed to have multiple devices on the same power bus. Communication with the transceivers can be done either single-ended or differentially, depending upon the noise immunity that is desired.

Figure 12:
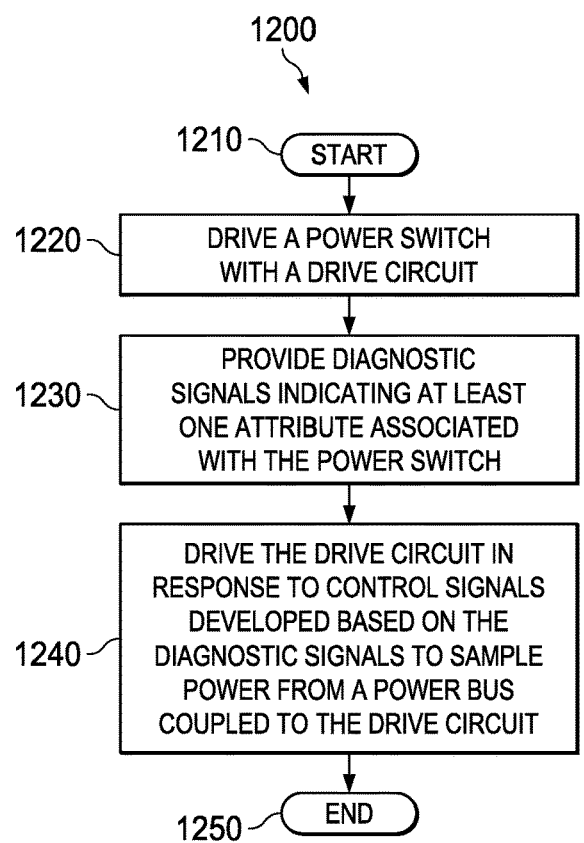
FIG. 12 is a flow diagram of one embodiment of a method of providing power and data communication to a solid-state relay.

FIG. 12 is a flow diagram of one embodiment of a method of providing power and data communication to a solid-state relay. The method begins in a start step 1210. In a step 1220, a power switch is driven with a drive circuit. In a step 1230, diagnostic signals indicating at least one attribute associated with the power switch are provided. In a step 1240, the drive circuit is driven in response to control signals developed based on the diagnostic signals to sample power from a power bus coupled to the drive circuit. The method ends in an end step 1250.

Those skilled in the art to which this application relates will appreciate that other and further additions, deletions, substitutions and modifications may be made to the described embodiments.

What is claimed is:

1. A switch controller, comprising:
    a microcontroller external to said switch controller;
    a monolithic substrate;
    a first and second drive circuit located on said monolithic substrate and configured to drive a respective first and second power switch, wherein said respective first and second power switch drives a respective first and second load;
    a diagnostics block located on said monolithic substrate and configured to provide diagnostic signals indicating at least one attribute associated with said first and second power switch; and
    a control block located on said monolithic substrate and configured to drive said first and second drive circuits in response to separate first and second control signals from said external microcontroller based on said diagnostic signals.

2. The switch controller as recited in claim 1 wherein said first and second power switches are transistors.

3. The switch controller as recited in claim 1 wherein said at least one attribute includes a current passing through said first and second power switch.

4. The switch controller as recited in claim 1 wherein said at least one attribute includes a temperature proximate said first and second power switch.

5. The switch controller as recited in claim 1 wherein said temperature is a temperature proximate a load powered by said first and second power switch.

6. The switch controller as recited in claim 1 further comprising a serial interface located on said monolithic substrate and configured to receive said control signals.

7. The switch controller as recited in claim 6 further comprising a sigma-delta modulator coupled to said serial interface and configured to convert said diagnostic signals to digital data for transmission by said serial interface.

8. The switch controller as recited in claim 1 further comprising a references block located on said monolithic substrate and configured to generate at least one reference signal for use by the switch controller.

9. An isolated system, comprising:
a monolithic substrate;
first and second gate drive circuits located on said monolithic substrate and configured to drive respective first and second power transistors, wherein said first and second power transistors drives a respective first and second load;
a control block located on said monolithic substrate and configured to drive said first and second gate drive circuits with separate first and second control signals based on diagnostic signals; and
a microcontroller external to said monolithic substrate and coupled to said control block and configured to receive said diagnostic signals and provide said control signals.

10. The isolated system as recited in claim 9 wherein said first and second power transistors are field-effect transistors.

11. The isolated system as recited in claim 9 further comprising a data bus coupled to said microcontroller and said control block and configured to communicate said separate first and second control signals.

12. The isolated system as recited in claim 11 further comprising an isolation circuit interposed in said data bus.

13. The isolated system as recited in claim 9 wherein said first and second power transistors are external to said monolithic substrate.

14. The isolated system as recited in claim 9 wherein said microcontroller is powered by a power supply coupled to an AC power bus coupled to said first and second power transistors.

15. The isolated system as recited in claim 14 further comprising an isolation circuit coupled between said power supply and said microcontroller.

16. The isolated system as recited in claim 6 wherein said microcontroller is a secondary microcontroller and said isolated system further comprises a primary microcontroller coupled to said secondary microcontroller.

17. A method of operating a first and second power switch, comprising:
driving said first and second power switch with a first and second drive circuit, respectively, wherein said respective first and second power switch drives a respective first and second load;
providing diagnostic signals indicating at least one attribute associated with said first and second power switch to a microcontroller external to said power switch; and
driving said first and second drive circuit in response to separate first and second control signals from said external microcontroller based on said diagnostic signals and in response to a current sampled from a power bus coupled to said drive circuit.

18. The method as recited in claim 17 wherein said first and second power switches are transistors.

19. The method as recited in claim 17 wherein said at least one attribute includes a current passing through said first and second power switch.

20. The method as recited in claim 17 wherein said at least one attribute includes a temperature proximate said power switch.

21. The method as recited in claim 17 further comprising receiving said control signals with a serial interface.

22. The method as recited in claim 17 further comprising converting said diagnostic signals to digital data for transmission by said serial interface.

23. The method as recited in claim 17 further comprising generating at least one reference signal.

* * * * *